(12) United States Patent
Ino et al.

(10) Patent No.: US 7,956,405 B2
(45) Date of Patent: Jun. 7, 2011

(54) SEMICONDUCTOR STORAGE ELEMENT AND MANUFACTURING METHOD THEREOF

(75) Inventors: Tsunehiro Ino, Fujisawa (JP); Shosuke Fujii, Yokohama (JP); Jun Fujiki, Yokohama (JP); Akira Takashima, Fuchu (JP); Masao Shingu, Kawasaki (JP); Daisuke Matsushita, Hiratsuka (JP); Naoki Yasuda, Yokohama (JP); Koichi Muraoka, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 38 days.

(21) Appl. No.: 12/404,648

(22) Filed: Mar. 16, 2009

(65) Prior Publication Data

US 2010/0078704 A1    Apr. 1, 2010

(30) Foreign Application Priority Data

Sep. 30, 2008  (JP) ................. P2008-252411

(51) Int. Cl.
*H01L 29/788* (2006.01)

(52) U.S. Cl. ................ 257/321; 257/E29.309

(58) Field of Classification Search .................. 257/324, 257/E29.309, E21.21, 321, E21.423, E21.679; 438/591, 288, 197
See application file for complete search history.

(56) References Cited

U.S. PATENT DOCUMENTS

| 2005/0136586 | A1* | 6/2005 | Ono ............................ 438/216 |
| 2007/0215958 | A1* | 9/2007 | Tanaka et al. ................ 257/411 |
| 2007/0287254 | A1* | 12/2007 | Natori et al. ................. 438/264 |
| 2008/0237688 | A1 | 10/2008 | Yasuda |
| 2009/0212346 | A1 | 8/2009 | Ino et al. |

FOREIGN PATENT DOCUMENTS

JP    2004-71877    3/2004

* cited by examiner

*Primary Examiner* — Thomas L Dickey
*Assistant Examiner* — Nikolay Yushin
(74) *Attorney, Agent, or Firm* — Oblon, Spivak, McClelland, Maier & Neustadt, L.L.P.

(57) ABSTRACT

A semiconductor storage element includes: a source region and a drain region provided in a semiconductor substrate; a tunnel insulating film provided on the semiconductor substrate between the source region and the drain region; a charge storage film provided on the tunnel insulating film; a block insulating film provided on the charge storage film; a gate electrode provided on the block insulating film; and a region containing a gas molecule, the region provided in a neighborhood of an interface between the charge storage film and the block insulating film.

21 Claims, 12 Drawing Sheets

- $Al_2O_3$ POLYCRYSTAL 13.1nm
- A
- $HfO_2$ ALMOST PERFECT SINGLE CRYSTAL 11.3nm
- $SiO_2$ 5.3nm
- Si SUBSTRATE

- $Al_2O_3$ CRYSTALLIZATION
- REGION 21
- B
- $SiO_2$
- Si SUBSTRATE

US 7,956,405 B2

SEMICONDUCTOR STORAGE ELEMENT AND MANUFACTURING METHOD THEREOF

CROSS-REFERENCE TO RELATED APPLICATIONS

This application is based upon and claims the benefit of priority from the prior Japanese Patent Application No. 2008-252411, filed on Sep. 30, 2008; the entire contents of which are incorporated herein by reference.

BACKGROUND OF THE INVENTION

1. Field of the Invention

The present invention relates to a semiconductor storage element and a manufacturing method of the semiconductor storage element.

2. Description of the Related Art

As miniaturization in a semiconductor integrated circuit constituting a nonvolatile storage circuit proceeds, a charge storage film being a storage substance is getting thinner. In particular, in a conventional MONOS (metal/oxide/nitride/oxide/semiconductor) type flash memory, silicon nitride (SiN) is used as a charge storage film (JP-A 2004-071877 (KOKAI)).

BRIEF SUMMARY OF THE INVENTION

However, a relative dielectric constant of silicon nitride (SiN) is about nine at the most, power thereof to shield accumulated electric charges being weak. Accordingly, as a charge storage film gets thinner as stated above, charges are not sufficiently stored. Further, it is suggested to use HfON, which has a high relative dielectric constant, as a charge storage film, but the usage of HfON is on the premise that charges are stored within an HfON film, and it is not possible to store exceeding charges. Thus, a mechanism capable of storing charges in higher density is required. In consideration of the above, an object of the present invention is to acquire a semiconductor storage element which can store and erase charges more efficiently and which holds accumulated charges for a long period of time compared with a conventional charge storage film using SiN, and a manufacturing method of the semiconductor storage element.

A semiconductor storage element according to an aspect of the present invention includes: a source region and a drain region provided in a semiconductor substrate; a tunnel insulating film provided on the semiconductor substrate between the source region and the drain region; a charge storage film provided on the tunnel insulating film; a block insulating film provided on the charge storage film; a gate electrode provided on the block insulating film; and a region containing a gas molecule, the region provided in a neighborhood of an interface between the charge storage film and the block insulating film.

A manufacturing method of a semiconductor storage element according to an aspect of the present invention includes: forming a tunnel insulating film on a semiconductor substrate; forming a charge storage film on the tunnel insulating film; forming a block insulating film on the charge storage film; denaturing the charge storage film by performing a thermal processing after forming the block insulating film, and forming a region containing a gas molecule in an interface between the charge storage film after denaturing and the block insulating film; and forming a gate electrode on the block insulating film.

DETAILED DESCRIPTION OF THE INVENTION

Hereinafter, embodiments of the present invention will be described in detail with reference to the drawings.

(Structure of Semiconductor Storage Element)

Figure 1:
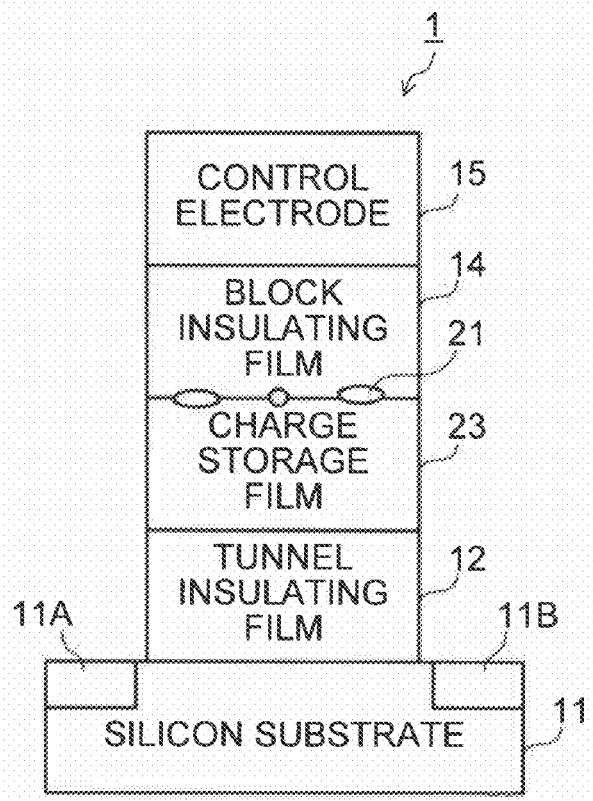
FIG. 1 is a cross-sectional view showing a fundamental structure of a semiconductor storage element.

FIG. 1 is a cross-sectional view showing a fundamental structure of a MONOS type semiconductor storage element 1 (hereinafter, simply referred to as a semiconductor storage element 1) according to the present embodiment. As shown in FIG. 1, the semiconductor storage element 1 has a MONOS (metal/oxide/nitride/oxide/semiconductor) type structure in which a tunnel insulating film 12, a charge storage film 23, a block insulating film 14 and a control electrode (gate electrode) 15 are sequentially formed on a silicon substrate 11. Further, in both sides of a multi-layered body of a constitution described above of the semiconductor substrate 11, a source region 11A and a drain region 11B are each formed. A region 21 is formed in an interface between the charge storage film 13 and the block insulating film 14, in a manufacturing process of the semiconductor storage element 1.

It should be noted that the above-described MONOS structure is a representative example of a structure of the semiconductor storage element 1 according to the invention of the present application. Thus, it is not necessarily required to adopt a multi-layered body of a MONOS type structure of, for example, metal/oxide/nitride/oxide/semiconductor, or the like.

The silicon substrate 11 is a substrate of single-crystal silicon (Si) whose (100) surface is exposed.

The tunnel insulating film 12 is formed on the (100) surface of the silicon substrate 11. A material of the tunnel insulating film 12 is silicon oxide ($SiO_2$). However, the material of the tunnel insulating film 12 is not limited to $SiO_2$ but various materials such as SiON can be used.

The charge storage film 23 is a hafnium oxide ($HfO_2$) film. The charge storage film 23 can be obtained by denaturing an HfON film with a nitride concentration of 2 atomic % in atomic ratio to an $HfO_2$ film by a thermal processing described later. Details of the processing to denature the HfON film to the $HfO_2$ film will be explained in later-described FIG. 2A to FIG. 4. It should be noted that the charge storage film 23 is not necessarily required to be entirely constituted with $HfO_2$ but can partially include nitride.

The region 21 is formed in the interface between the charge storage film 13 and the block insulating film 14 in the manufacturing process of the semiconductor storage element 1. A forming method of the region 21 will be described in detail later by using FIG. 2A to FIG. 2F. The region 21 means a region in which a nitride molecule or rare gas is contained, that is, a region containing a gas molecule. The region 21 has a granular structure in which the nitride molecule or the rare gas is contained.

The block insulating film 14 is disposed on the charge storage film 23 by an MBE (Molecular Beam Epitaxy) method. A material of the block insulating film 14 is aluminum oxide ($Al_2O_3$). A film thickness of the block insulating film 14 is 13 nm. It should be noted that for forming of the block insulating film 14 not only the MBE method but also various methods such as a CVD (Chemical Vapor Deposition) method can be used. Further, the material of the block insulating film 14 is not limited to aluminum oxide but it is possible to use various insulating films having high electrical insulating performance such as silicon oxide ($SiO_2$) and others. It is important to have a block insulating film 14 containing oxygen.

The control electrode 15 is an electrode formed on the block insulating film 14 by a resistance heating deposition method. A material of the control electrode 15 is gold (Au), which is superior in electrical conduction and thermal conduction. It should be noted that for forming of the control electrode 15, not only the resistance heating deposition method but also various methods such as a sputtering method can be used. Further, the material of the control electrode 15 is not limited to Au but another material with superior electrical conduction can be used. It is better if the material of the control electrode 15 has superior heat resistance. Further, it is still better if a work function is adjusted to have an appropriate value, and it is also possible to use, for example, Ta electrode or a Ta compound electrode.

(Manufacturing Method of Semiconductor Storage Element)

FIG. 2A to FIG. 4 are explanatory diagrams of a manufacturing method of a semiconductor storage element 1. Hereinafter, the manufacturing method of the semiconductor element 1 according to the present embodiment will be described by using FIG. 2A to FIG. 4.

First, a natural oxide film formed on a (100) surface of a silicon substrate 11 is removed with dilute hydrofluoric acid. Next, the silicon substrate 11 is heat-oxidized and an $SiO_2$ film (tunnel insulating film 12) is formed on the (100) surface of the silicon substrate 11. Next, an HfON film (charge storage film 13) is formed in a thickness of 11 nm on the $SiO_2$ film by a chemical sputtering method. A nitrogen concentration of the HfON film is 2 atomic % in atomic ratio.

It should be noted that forming of the charge storage film 13 can be done not only by the chemical sputtering method but various methods such as a CVD (Chemical Vapor Deposition) method, but an ALD (Atomic Layer Deposition) method and an EB (Electron Beam) deposition method can also be used.

Figure 2A:
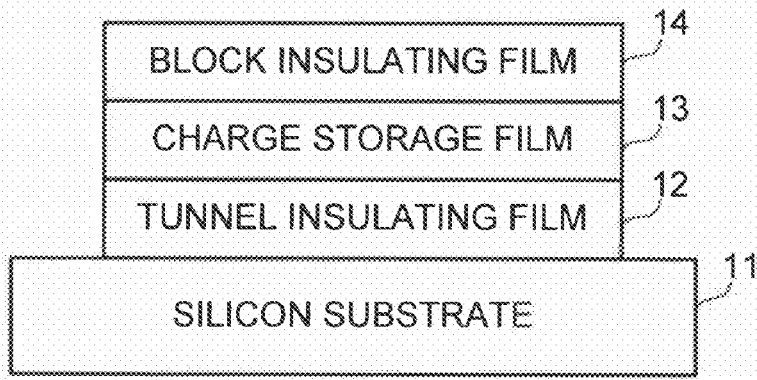
FIG. 2A is an explanatory diagram of a manufacturing method of the semiconductor storage element.

Next, an $Al_2O_3$ film (block insulating film 14) is formed in a thickness of 13 nm on the HfON film (charge storage film 13) by an MBE method. FIG. 2A shows such a state.

Figure 2B:
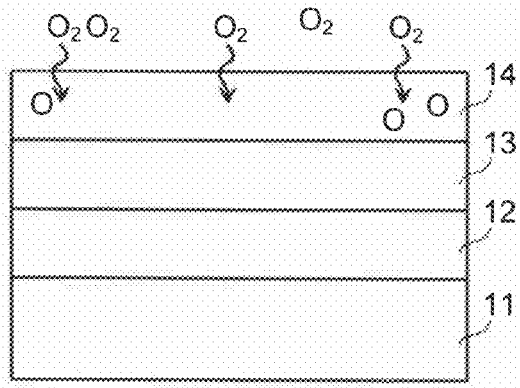
FIG. 2B is an explanatory diagram of the manufacturing method of the semiconductor storage element.

After the $Al_2O_3$ film is formed, a thermal processing at 1000° C. for thirty seconds is performed in an oxygen environment. In this thermal processing process, oxygen ($O_2$) in the atmosphere penetrates (diffuses) in the $Al_2O_3$ film. FIG. 2B shows such a state.

Figure 2C:
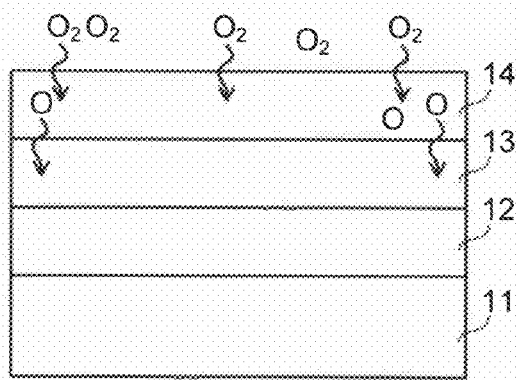
FIG. 2C is an explanatory diagram of the manufacturing method of the semiconductor storage element.

Then, as shown in FIG. 2C, oxygen ($O_2$) penetrates in the $Al_2O_3$ film and oxygen in the $Al_2O_3$ film penetrates in the HfON film. FIG. 2C shows such a state.

Figure 2D:
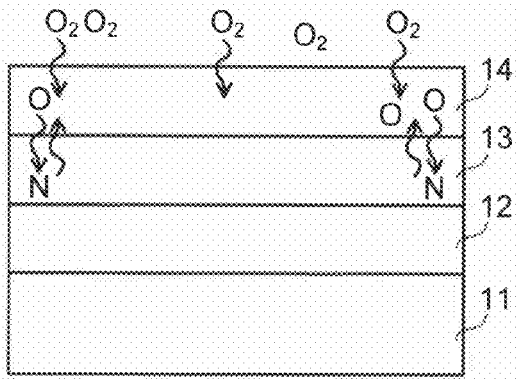
FIG. 2D is an explanatory diagram of the manufacturing method of the semiconductor storage element.

Here, oxygen (O) has a stronger bonding strength with hafnium (Hf) than nitrogen (N). Therefore, N bonded to Hf is replaced by O penetrating in the HfON film and N is separated. Then, the separated N is eliminated from the HfON film. FIG. 2D shows such a state.

Figure 2E:
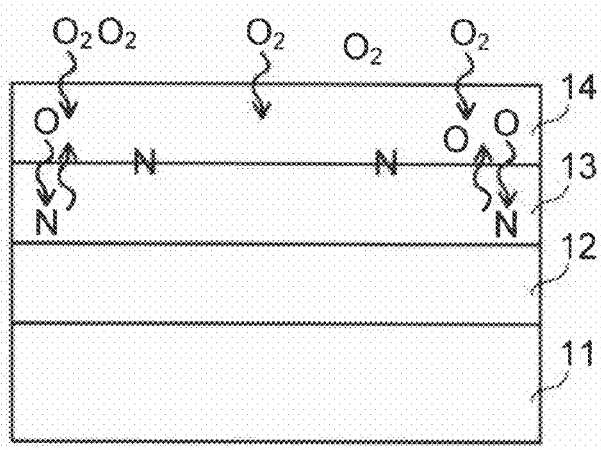
FIG. 2E is an explanatory diagram of the manufacturing method of the semiconductor storage element.

Meanwhile, N eliminated from the HfON film cannot pass through the $Al_2O_3$ film. Therefore, N segregates in the interface between the HfON film and the $Al_2O_3$ film. FIG. 2E shows such a state.

Figure 2F:
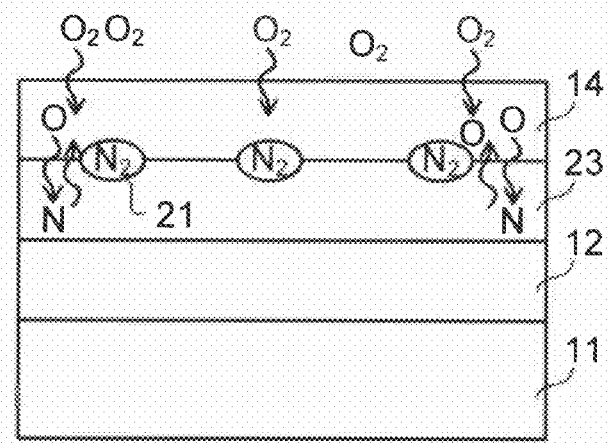
FIG. 2F is an explanatory diagram of the manufacturing method of the semiconductor storage element.

Then, N in the HfON film is almost completely eliminated and an $N_2$ molecule made by N atoms being bonded to each other is formed. The formed $N_2$ molecule is not bonded to Hf again. Thus, the HfON film 13 is denatured to an $HfO_2$ film 23 and a region 21 containing the $N_2$ molecule is formed in a neighborhood of an interface between $HfO_2$ film and the $Al_2O_3$ film. FIG. 2F shows such a state.

Figure 3:
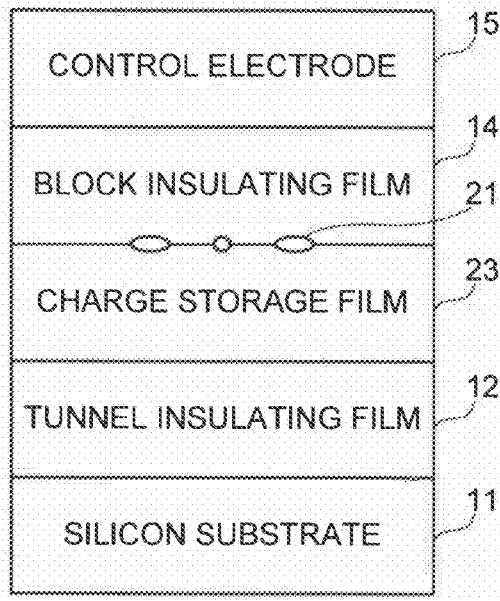
FIG. 3 is an explanatory diagram of the manufacturing method of the semiconductor storage element.
Figure 4:
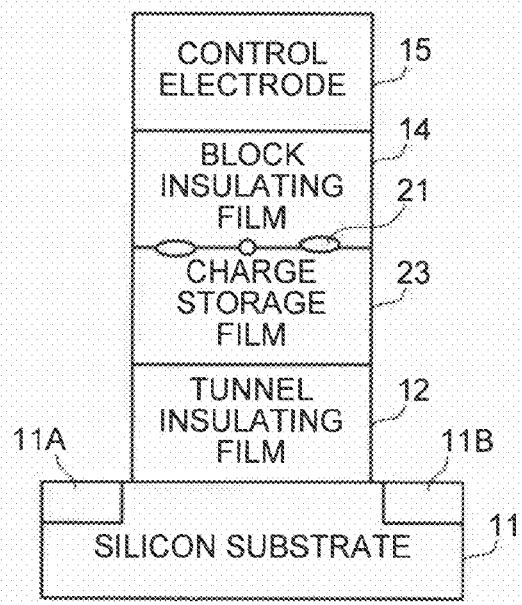
FIG. 4 is an explanatory diagram of the manufacturing method of the semiconductor storage element.

After the region 21 is formed by the thermal processing, the control electrode 15 is formed on the $Al_2O_3$ film by a resistance heating deposition method. FIG. 3 shows such a state. Further, a multi layered body of the silicon substrate 11 is subjected to patterning, the multi layered body being constituted with the tunnel insulating film 12 to the control electrode 15, and surface layer portions of the silicon substrate 11 of both sides of the multi layered body are impurity doped, so that a source region 11A and a drain region 11B are formed. FIG. 4 shows such a state.

EXAMPLE (Erasing Characteristics)

Figure 5:
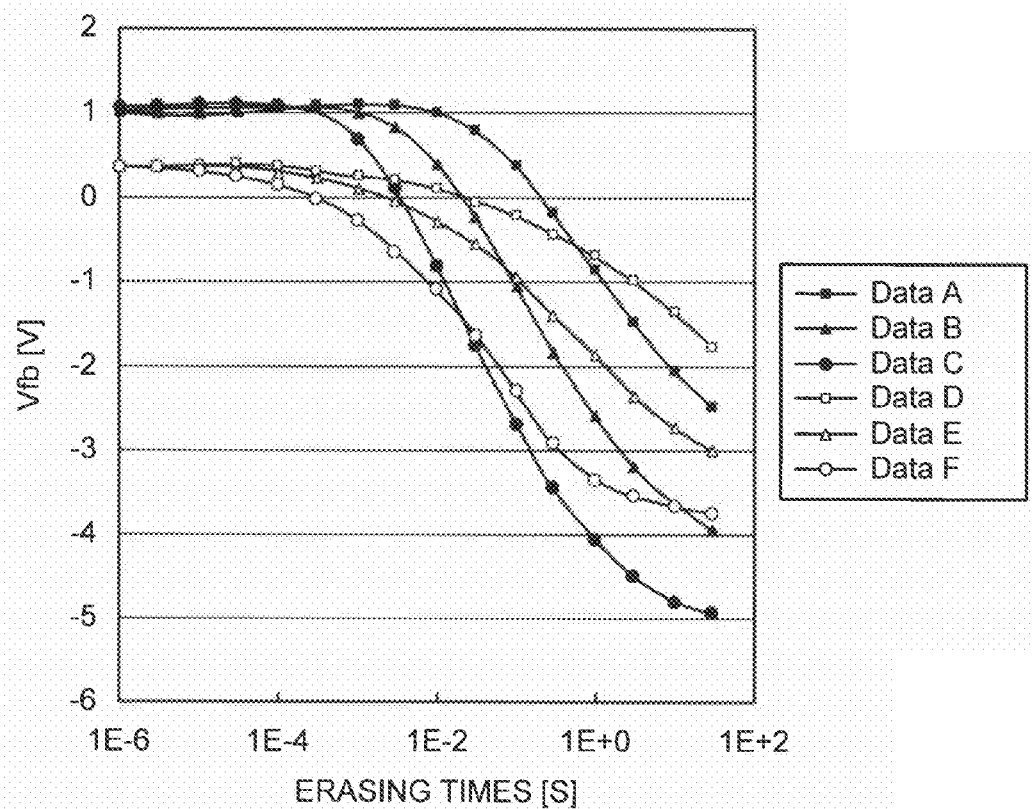
FIG. 5 is an example of a measured result of a shift amount of a flat band voltage Vfb at an quasi-static time.

FIG. 5 is an example of a measured result of characteristics (CV characteristics) of a quasi-static capacitance of a sample (hereinafter, simply referred to as a sample) made by methods described in FIG. 2A to FIG. 4. It should be noted that a measured result of a sample in which SiN is used as a charge storage film is shown for comparison. In FIG. 5, an abscissa axis indicates time periods(s) during which an erasing voltages is applied while an ordinate axis indicates flat band voltages (Vfb).

The CV characteristics are measured as below.
1. A write voltage of 20V and 1 ms is applied to the sample.
2. Erasing voltages of −14 V, −16 V and −18V are applied to the sample for different time periods.
3. The characteristics (CV characteristics) of the quasi-static capacitance in relation to the erasing voltage are measured.

Data A is a measured result in a case that the erasing voltage of −14V is applied to a sample H of the present application. Data B is a measured result in a case that the erasing voltage of −16V is applied to the sample H. Data C is a measured result in a case that the erasing voltage of −18 V is applied to the sample H. An effective oxide thickness (EOT) of $HfO_2$ being the charge storage film of the sample H is 2.5 nm.

Data D is a measured result in a case that the erasing voltage of −14V is applied to a sample S having a charge storage film whose material is SiN. Data E is a measured result in a case that the erasing voltage of −16V is applied to the sample S having the charge storage film whose material is SiN. Data F is a measured result in a case that the erasing voltage of −18V is applied to the sample S having the charge storage film whose material is SiN. A film thickness of SiN of the sample S is 5 nm (EOT is 2.5 nm). It should be noted that the sample H and the sample S each have the same EOTs in terms of the block insulating films, the charge storage films and the tunnel insulating films.

FIG. 5 indicates that, in a case that the data A and data D, in which the same erasing voltage is applied, a shift amount of the flat band voltage Vfb of data A is larger than a shift amount of the flat band voltage Vfb of data D when an application time of the erasing voltage is equal to or more than a given time.

In other words, it is found that, if the application time of the erasing voltage is the same, more charges are erased in the sample H from which the data A is obtained compared with the sample S from which the data D is obtained. It is also found that the application time of the erasing voltage necessary for the sample H from which the data A is obtained to reach the same flat band voltage Vfb is shorter compared with the sample S from which the data D is obtained.

It is also indicated that, in a case that the data B and the data E are compared and in a case that the data C and the data F are compared, when the application time of the erasing voltage is equal to or larger than a given time, shift amounts of the flat band voltages Vfb of the sample H from which the data B, C are obtained are larger than the shift amounts of the flat band voltages Vfb of the sample S from which the data E, F are obtained.

It is found from the above that when the sample H of the present application is used, charges stored in the charge storage film can be erased effectively in a shorter application time of the erasing voltage than in a case of the sample S using SiN as the charge storage film. It should be noted that values of the flat band voltages Vfb of the sample H and the sample S at an erasing time of 1 μs are different. This is due to a difference in sample structures, and does not influence a conclusion obtained from the results of present measurements.

Figure 6:
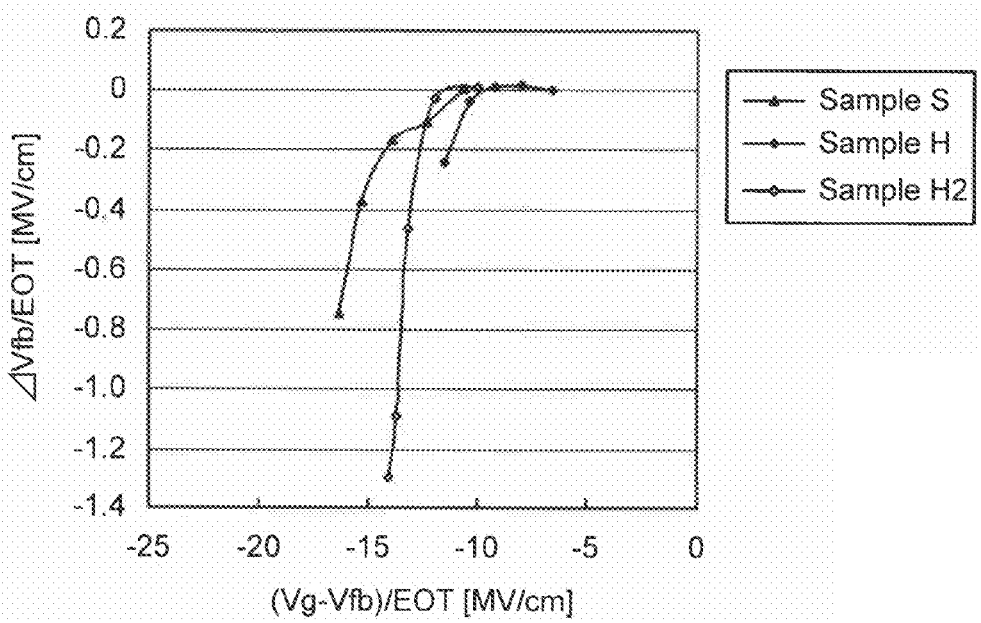
FIG. 6 is an example of a measured result of a shift amount of a flat band voltage Vfb standardized by an EOT at an erasing time.

FIG. 6 is an example of a measured result of a shift amount (variation) of a flat band voltage Vfb normalized by the electric field of the tunneling insulating film, showing that the sample H is adapted to the present application in an erasing time. It should be noted that there are also indicated measured results of a sample H2 whose charge storage film is made thinner than the sample S using SiN as the charge storage film and the sample H of the present application, for the sake of comparison. The sample H2 is a sample whose EOT is made much thinner than that of the conventional sample using SiN as the material of the charge storage film. When semiconductor storage elements are miniaturized, electric interferences between neighboring semiconductor storage elements increase. However, thinning in a film thickness in a film thickness direction, that is, EOT, can alleviate the electric interference, and can contribute to miniaturization of the semiconductor storage element.

In FIG. 6, an abscissa axis indicates electric fields to erase by converting a value obtained by subtracting a flat band voltage Vfb from a net erasing voltage Vg into a value per EOT (Effective Oxide Thickness) and normalizing the value. Meanwhile, an ordinate axis indicates erased electric fields by converting a variation of a flat band voltage Vfb at the application time of the erasing voltage into a value per EOT and normalizing the value.

Measurement is done as below.
1. A write voltage of 20 V and 1 ms is applied to the sample.
2. Flat band voltages Vfb at times that erasing voltages of −20 V, −18 V, −16 V, −14 V, −12 V are applied in an amount of 100 μs are measured.
3. Flat band voltages Vfb at times that erasing voltages of −20 V, −18 V, −16 V, −14 V, −12 V are applied in an amount of 1 ms are measured.

"Sample H" indicates a measured result in a case that a film thickness of the $HfO_2$ film (charge storage film 23) is 11 nm (EOT is 2.5 nm). "Sample H2" indicates a measured result in a case that the film thickness of the $HfO_2$ film is 4 nm (EOT is 0.9 nm). "Sample S" indicates a measured result that a film thickness of SiN is 5 nm (EOT is 2.5 nm).

In FIG. 6, it is meant that a superior charge storage film is the one having a larger absolute value of a shift amount of the flat band voltage indicated by the ordinate axis even when erasing of charges is done at a small absolute value of the tunnel electric field indicated by the abscissa axis. In other words, in FIG. 6, it is meant that the charge storage film having numerous measured data in a lower right side of the graph is superior in erasing characteristics of the charge storage film.

As indicated in FIG. 6, data points of the samples H and H2 of the present application exist in the lower right side compared with data points of the conventional sample S. Based on the above, it is found that the samples H and H2 of the present application are samples having superior erasing characteristics compared with the conventional sample S. In other words, it is found that if the sample of the present application is used, charges accumulated in the charge storage film can be effectively erased in a shorter application time of the erasing voltage than in a case that SiN is used as the charge storage film.

(Writing Characteristics)

Figure 7:
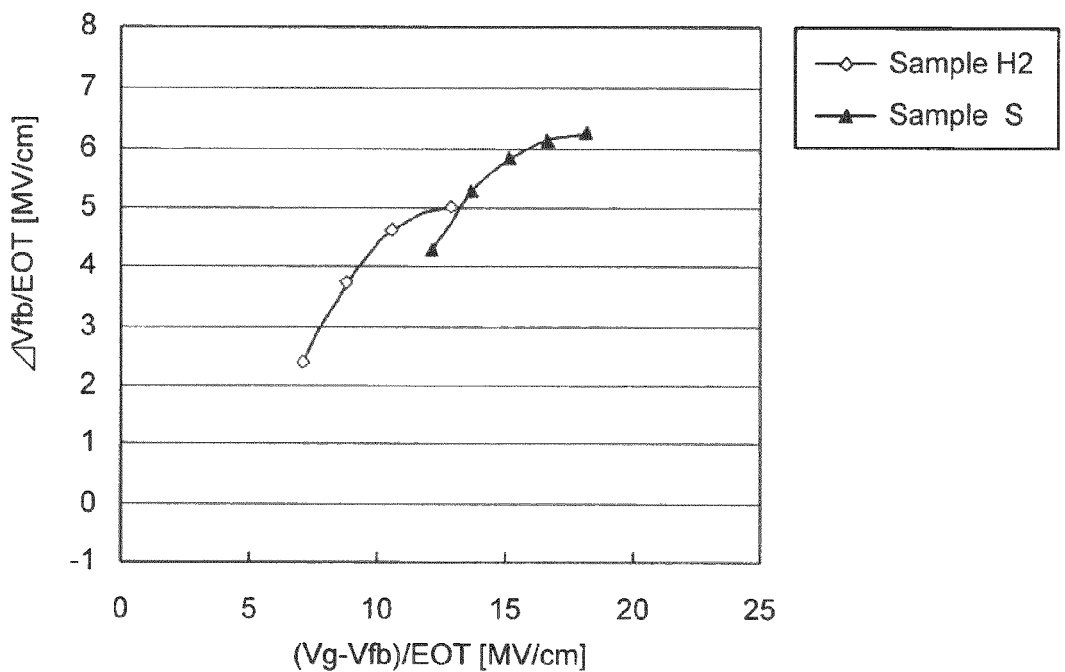
FIG. 7 is an example of a measured result of a shift amount of a flat band voltage Vfb standardized by an EOT at a write time.

FIG. 7 is an example of a measured result of a shift amount (variation) of a flat band voltage Vfb to the tunnel electric field at a write time. It should be noted that a measured result of the sample S using SiN as the charge storage film is also shown for the sake of comparison.

In FIG. 7, an abscissa axis indicates electric fields to write by converting a value obtained by subtracting Vfb from a net write voltage Vg into a value per EOT (Effective Oxide Thickness) and normalizing the value. Meanwhile, an ordinate axis indicates written electric fields by converting a variation (hereinafter, referred to as a shift amount) of a flat band voltage Vfb at an application time of the write voltage into a value per EOT and normalizing the value.

Measurement is done as below.
1. An erasing voltage of −20 V and 1 ms is applied to the sample.
2. As for the sample H2, flat band voltages Vfb at times that write voltages of 14 V, 12 V, 10 V, 8 V are applied in an amount of 100 μs are measured.
3. As for the sample S, flat band voltages Vfb at times that write voltages of 24 V, 22 V, 20 V, 18 V, 16 V are applied in an amount of 100 μs are measured.

It should be noted that the EOT of the charge storage film of the sample H2 is much thinner than that of the sample S. Thus, in order that the electric field applied to the charge storage film becomes about the same, it is not necessary to apply a high write voltage. Accordingly, different write voltages are applied to the sample H2 and the sample S and the measurement is done, as stated above.

"Sample H2" indicates a measured result in a case that the film thickness of the $HfO_2$ film is 4 nm (EOT is 0.9 nm). "Sample S" indicates a measured result in a case that the film thickness of SiN is 5 nm (EOT is 2.5 nm).

In FIG. 7, it is meant that a superior charge storage film is one in which an absolute value of a shift amount of the flat band voltage of the ordinate axis becomes large even if writing is done at a small absolute value of the tunnel electric field of the abscissa axis.

In other words, in FIG. 7, it is meant that the charge storage film having numerous measured data in an upper left side of the graph is superior in writing characteristics of the charge storage film.

As shown in FIG. 7, since data points of the sample H2 of the present application exist in an upper left side of data points of the conventional sample S, it is found that the sample H2 of the present application is a superior sample compared with the conventional sample S. In other words, it is found that when the sample of the present application is used charges can be stored in the charge storage film effectively with a shorter application time of the write voltage than in a case that SiN is used as the charge storage film.

(Charge Holding Characteristics)

Figure 8:
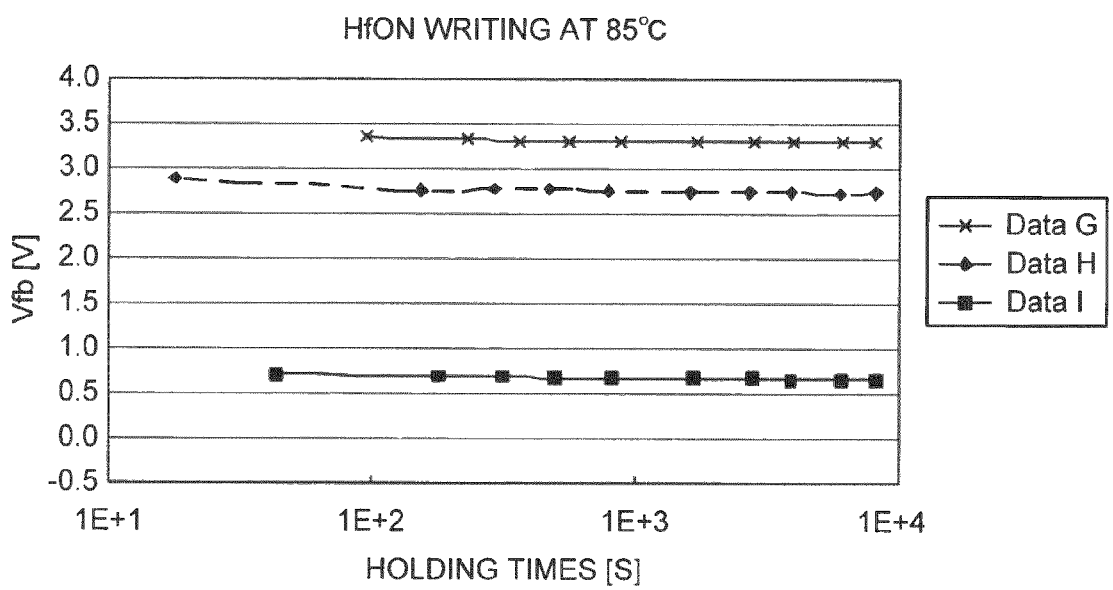
FIG. 8 is an example of a measured result of charge holding characteristics.

FIG. 8 is an example of a measured result of charge holding characteristics of the sample of the present application. In FIG. 8, an abscissa axis indicates time periods of measurement of a flat band voltage after charge writing. An ordinate axis indicates flat band voltages Vfb.

Measurement is done as below.
1. The sample is heated to a temperature of 85° C.
2. An erasing voltage of −20 V and 1 ms is applied to the sample.
3. A write voltage of 16 V is applied for 30 μs or 3 μs, or no write voltage is applied, whereby the flat band voltages are shifted to values of 3.4 V, 2.8 V or 0.7 V, respectively.
4. The values of the flat band voltages Vfb are kept measured while time passes from 20 s to 8000 s.

Data G is a measured result indicating a temporal change of the flat band voltage in a case that the flat band voltage is shifted to 3.4 V by applying the write voltage of 16 V for 30 μs. Data H is a measured result indicating a temporal change of the flat band voltage in a case that the flat band voltage is shifted to 2.8 V by applying the write voltage of 16 V for 3 μs. Data I is a measured result indicating a temporal change of the flat band voltage in a case that the flat band voltage is kept at 0.7 V by applying no write voltage.

It is found from the measured results of Data G to Data I that the flat band voltages Vfb scarcely change due to a lapse of time regardless of values of the written flat band voltages. It is found from the above that time-dependent changes of the flat band voltages Vfb are scarce at the temperature of 85° C.

and the holding characteristics of written charges is good. It should be noted that it is confirmed that the charge holding characteristics are also good at a temperature of 125° C., though not shown in the graph.

(Cross-sectional Photographic View of Semiconductor Storage Element)

Figure 9:
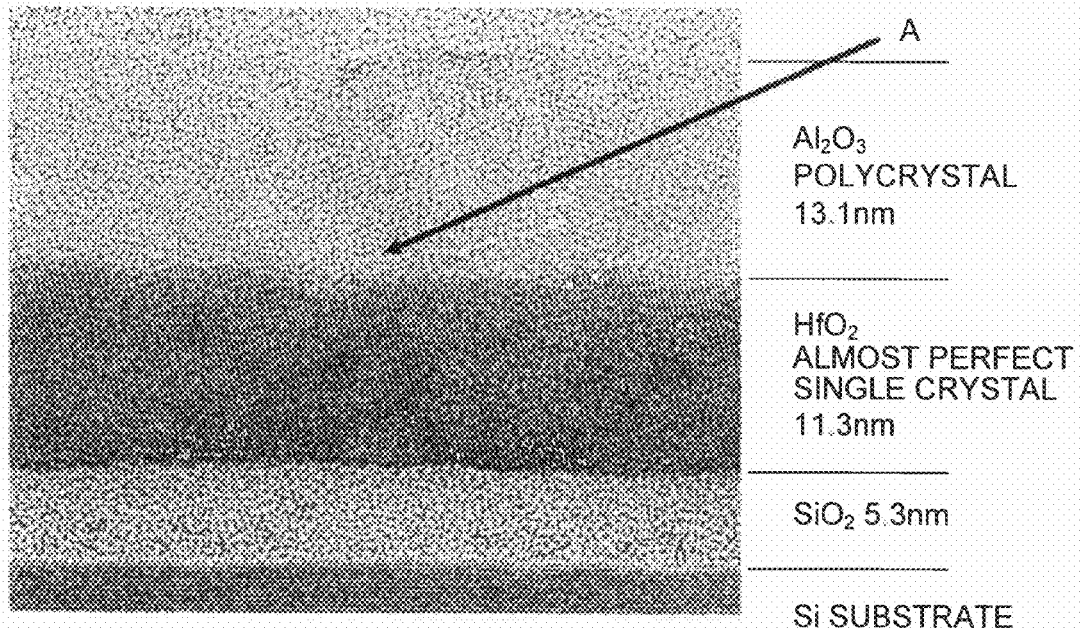
FIG. 9 is a cross-sectional photographic view by a TEM.

FIG. 9 is a cross-sectional photographic view of the sample of the present application. The photograph is taken with a TEM (transmission electron microscope).

In the TEM photograph of FIG. 9, there are captured, from below, a silicon substrate 11, a $SiO_2$ film (tunnel insulating film 12), an $HfO_2$ film (charge storage film 23), and an $Al_2O_3$ film (block insulating film 14). Here, respective film thicknesses of the $SiO_2$ film, the $HfO_2$ film and the $Al_2O_3$ film are 5.3 nm, 11.3 nm and 13.1 nm. A film which is of HfON with a nitrogen content ratio [N] of 2 atomic % at a time of deposition changes to of $HfO_2$ as a result that almost all the nitrogen in the film is eliminated by a thermal processing, and further, the film is an almost homogeneous single-crystalline film. Here, [N]=N/(Hf+O+N) atomic %.

It is found from the TEM photograph of FIG. 9 that there exists a portion (indicate by mark A) of a paler color of the photograph in an interface between the $HfO_2$ film and the $Al_2O_3$ film compared with the $HfO_2$ film and the $Al_2O_3$ film. This means an existence of a portion of lower density compared with the $HfO_2$ film and the $Al_2O_3$ film. In the sample of the present application, a main constituent of a material filling the portion of the lower density compared with the $HfO_2$ film and the $Al_2O_3$ film such as above is a nitrogen molecule, that is, $N_2$.

Figure 10:
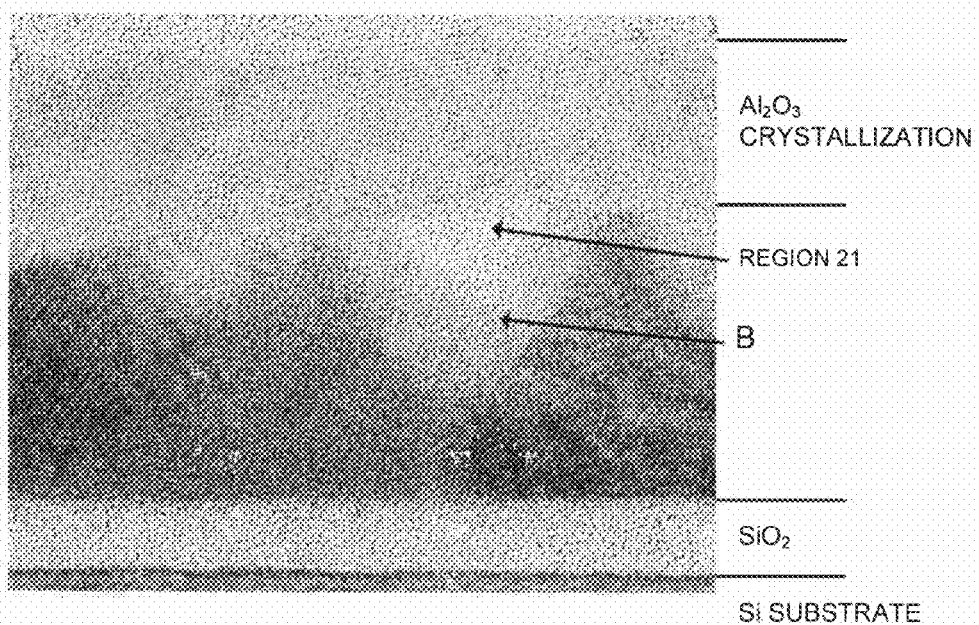
FIG. 10 is a cross-sectional photographic view by a TEM.

FIG. 10 is a cross-sectional photographic view of a sample whose nitrogen content ratio [N] in a film of HfON composition before denaturation is 19 atomic %. The photograph is taken with a TEM similarly to in FIG. 9. Further, FIG. 11 is a TEM photograph in which the sample shown in FIG. 10 is captured in low magnification.

In the TEM photographs of FIG. 10 and FIG. 11, there are each captured, from below, a silicon substrate 11, an $SiO_2$ film (tunnel insulating film 12), an $HfO_2$ film (whose composition before denaturation is HfON), and an $Al_2O_3$ film (block insulating film 14).

It is found from the TEM photograph of FIG. 10 that in the sample whose nitrogen content ratio [N] in the film of the HfON composition before the denaturation is 19 atomic %, irregularities of an interface between the film (having been the charge storage film 13 before denaturation) having had the HfON composition and the $Al_2O_3$ film (block insulating film 14) is quite high. Further, there is dark and light coloring portion (indicate by mark B) in the film having had the HfON composition. It is considered that this is a result that the film having had the HfON composition is polycrystalized after denaturation, unsimilarly to in a case that the nitrogen content ratio [N] of the film having had the HfON composition before denaturation is 2 atomic %, shown in FIG. 9.

Figure 11:
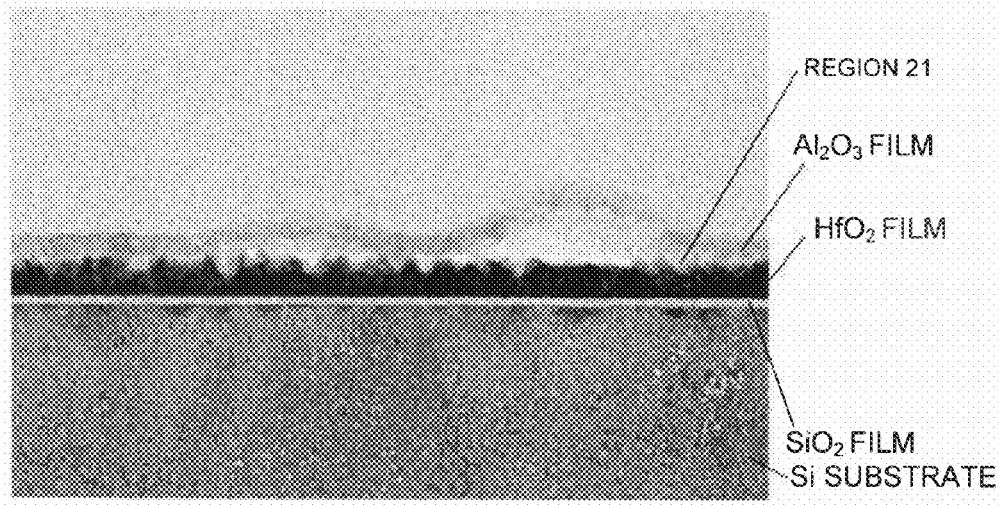
FIG. 11 is a cross-sectional photographic view by a TEM.

Further, it is also found from the TEM photograph of FIG. 11 that there is generated a region containing gas molecules in the entire interface between the $HfO_2$ film having had the HfON composition and the $Al_2O_3$ film and swelling occurs in the $Al_2O_3$ film. Part or all of nitrogen in the $HfO_2$ film is replaced by oxygen and the $HfO_2$ film is polycrystalized.

It is considered that, in the sample of the nitrogen content ratio [N] of 19 atomic %, an amount of N replaced by O at a time of a thermal processing is large and an amount of $N_2$ segregated in the interface between the film having had the HfON composition and the $Al_2O_3$ film is also large. In other words, it is considered that since the amount of segregated $N_2$ is large, the regions containing the gas molecules become large and are linked to each other, so that swelling occurs in the $Al_2O_3$ film.

On the other hand, in a case of the sample of the present application shown in FIG. 9, an amount of N replaced by O at a time of a thermal processing is small. Thus, it is considered that an amount of $N_2$ segregated in the interface between the film having had the HfON composition, that is, the $HfO_2$ film after denaturation, and the $Al_2O_3$ film is also small, and that only a small region containing gas molecules is generated in the interface.

FIG. 12 to FIG. 15 are views showing results of measurement of the sample of the present application whose nitrogen content ratio [N] in the film of the HfON composition before denaturation is 2 atomic % by using a TEM-EELS in which a transmission electron microscopy (TEM) and an electron energy-loss spectroscopy (EELS) are combined.

Figure 12:
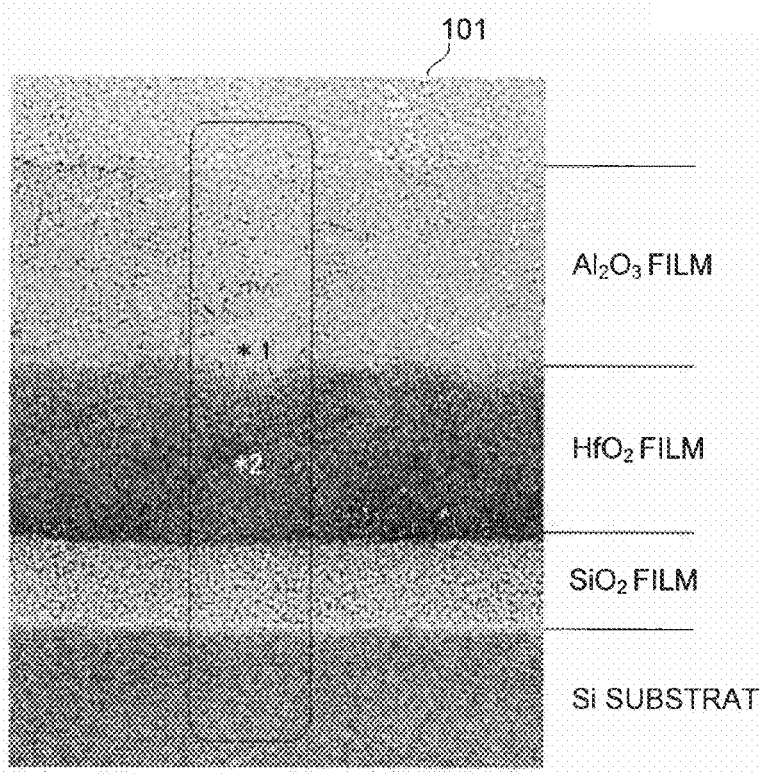
FIG. 12 is a view showing a measurement spot by a TEM-EELS.

FIG. 12 is across-sectional photographic view of the sample of the present application. In the cross-sectional photographic view of FIG. 12, there are captured, from below, a silicon substrate 11, an $SiO_2$ film (tunnel insulating film 12), an $HfO_2$ film (charge storage film 23), and an $Al_2O_3$ film (block insulating film 14). A frame 101 in FIG. 12 indicates a measurement region (integral region) by the EELS. Further, marks *1 and *2 (outline typeface) in FIG. 12 indicate measurement points by the EELS.

Figure 13:
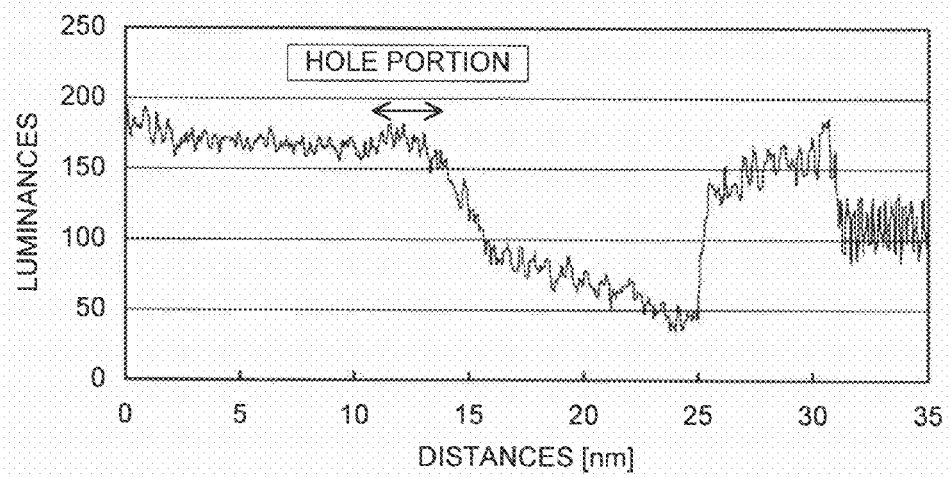
FIG. 13 is a graph plotted with luminances of a photograph averaged in a horizontal direction being indicated by an ordinate axis and distances in a vertical direction being indicated by an abscissa axis, in a strip-shaped region shown in FIG. 12.

FIG. 13 is a graph indicating an integral result of the frame 101 in FIG. 12. In FIG. 13, an abscissa axis indicates distances from the top of the frame 101 shown in FIG. 12. Further, an ordinate axis indicates luminances.

As shown in FIG. 13, a portion of around 0 nm to 12 nm in distance from the top of the frame 101 is the $Al_2O_3$ film (block insulating film 14). A portion of around 12 nm to around 25 nm is the $HfO_2$ film (charge storage film 23). A portion of around 25 nm to around 31 nm is the $SiO_2$ film (tunnel insulating film 12). A portion from around 31 nm is the Si substrate (silicon substrate 11). Further, there is a portion in which the region 21 exists, around 12 nm being the interface between the $Al_2O_3$ film and the $HfO_2$ film.

Figure 14:
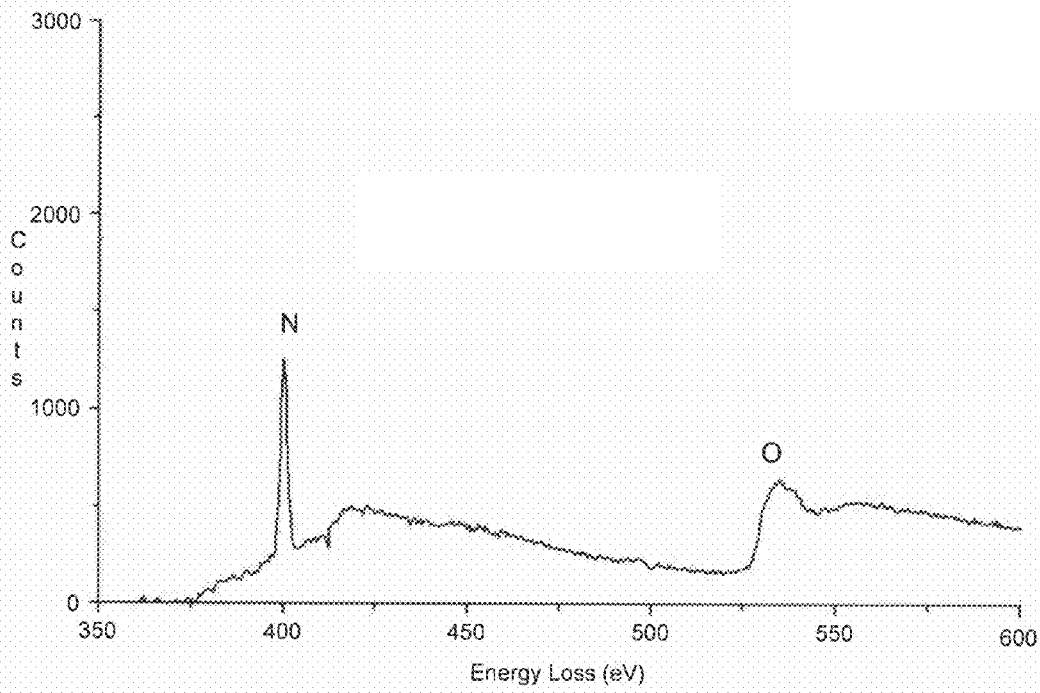
FIG. 14 is a result of measurement of a point marked as *1 in FIG. 12 by a TEM-EELS.

FIG. 14 is a graph showing a measured result by a TEM-EELS at the measurement point *1 in FIG. 12. In FIG. 14, an abscissa axis indicates energy losses. An ordinate axis indicates counts. The counts are values related to absorption intensity of energy.

In FIG. 14 peaks appear around 400 eV and 530 eV and existence of nitrogen (N: 400 eV) and oxygen (O: 530 eV) can be confirmed. Further, the quite acute peak of nitrogen (N) means that N exists as a molecule, that is, in a gas state of $N_2$.

Figure 15:
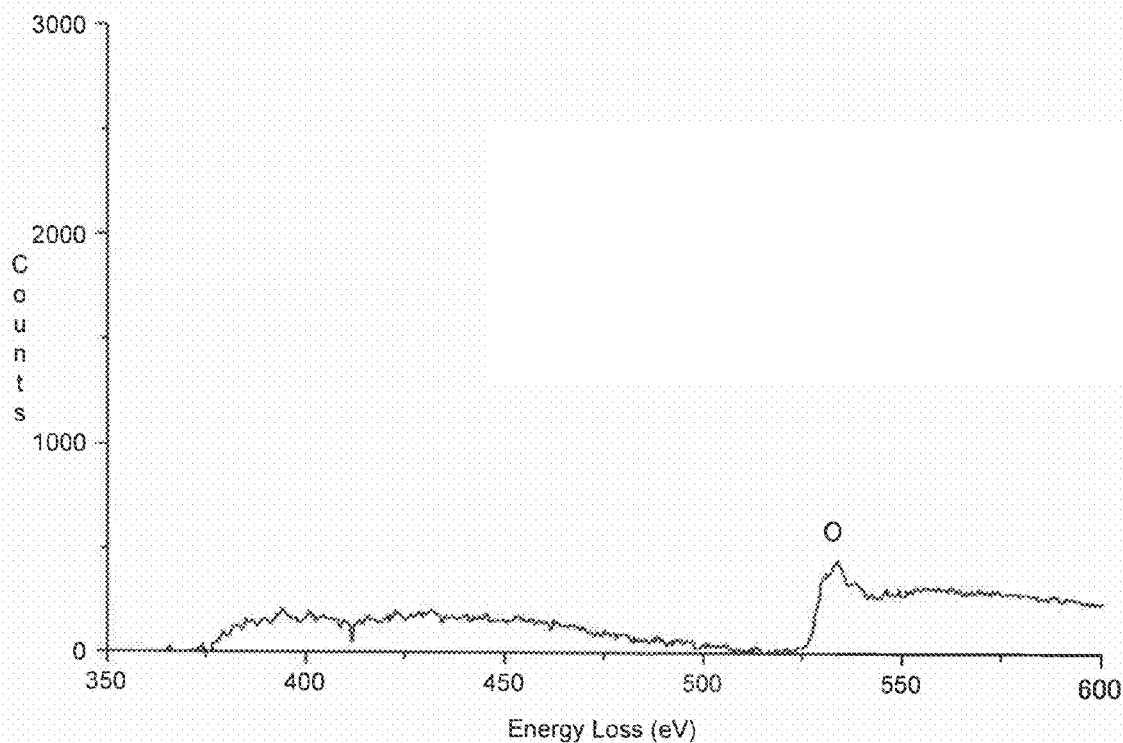
FIG. 15 is a result of measurement of a point marked as *2 in FIG. 12 by a TEM-EELS.

FIG. 15 is a graph showing a measured result by a TEM-EELS at the measurement point *2 in FIG. 12. In FIG. 15 an abscissa axis indicates energy losses. An ordinate axis indicates counts.

Since a peak of nitrogen (N) does not exist around 400 eV in FIG. 15, it is found that nitrogen (N) in the HfON film is replaced by oxygen (O) and nitrogen (N) is completely removed from the HfON film, so that the film becomes an $HfO_2$ film. However, there is a possibility that N exists in the interface portion with a block film though no nitrogen is observed at a position in a central part of a film having been HfON, such as the measurement position *2 shown in FIG. 12. However, at a present technology level of the TEM-EELS measurement, a range which can be composition-analyzed is 3 nm at the most and a composition of a region smaller than the above cannot be analyzed, so that it is difficult to confirm existence of the nitrogen described above.

Based on the above, it is considered that the charge storage characteristics of the charge storage film 13 is improved as a result of forming the region containing the gas molecule in an appropriate size.

Figure 16:
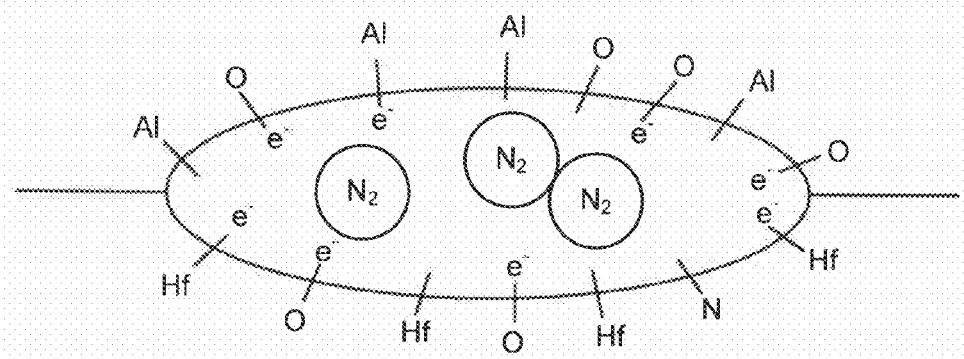
FIG. 16 is a diagram showing an example of a model of a region containing a gas molecule.

Hereinafter, there will be described a reason why forming the region containing the gas molecule in the appropriate size improves the charge storage characteristics of the charge storage film 13. FIG. 16 is a model diagram showing the region 21. As shown in FIG. 16, it is considered that a dangling bond of an atom constituting the charge storage film 23 ($HfO_2$) and the block insulating film ($Al_2O_3$) exists on a wall surface of the region 21. It is also considered that as a result that a charge is caught by the dangling bond the charge storage characteristics of the charge storage film 13 is improved.

It is considered from the result indicated in FIG. 15 that in the charge storage film 23 nitrogen in the film is eliminated. However, it is difficult to confirm at present whether nitrogen in the block insulating film 14 around an interface with the region 21 is completely eliminated. When considering a mechanism of nitrogen elimination, as a matter of course, a possibility can be expected that a portion in which much nitrogen bonded with a film-constituting element exists in the interface between the charge storage film 23 and the block insulating film 14. However, whether or not nitrogen remains in the charge storage film 23 in a neighborhood of the interface with the region 21 is not important in the present embodiment.

In other words, in FIG. 16 is shown the model diagram on the assumption that a nitrogen atom in the charge storage film 23 in the neighborhood of the interface with the region 21 remains. However, in a case that no nitrogen atom remains, a model in which the nitrogen atom portion in FIG. 16 is replaced by an oxygen atom can be made. There is a possibility, as a matter of course, that nitrogen is bonded to an atom constituting the block insulating film 14, in the block insulating film 14 in the neighborhood of the interface with the region 21. In such a case, there can be made a model in which part of an oxygen atom portion in the block insulating film 14 in FIG. 16 is replaced by a nitrogen atom.

Further, as a matter of course, there can be made a model in which nitrogen atoms exist both in the charge storage film 23 in the neighborhood of the interface with the region 21 and in the block insulating film 14 in the neighborhood of the interface with the region 21, and a model in which no nitrogen atom exists in either of the films at all.

In a conventional charge storage film using SiN or HfON, a charge is stored as a result of being caught by a crystal defect. In the structure shown in the present application, it is considered that the charge storage characteristics of the charge storage film is improved since a large amount of charges are stored not only in the crystal defect in the charge storage film but also in the dangling bond existing in the interface between the block film and the charge storage film.

Figure 17:
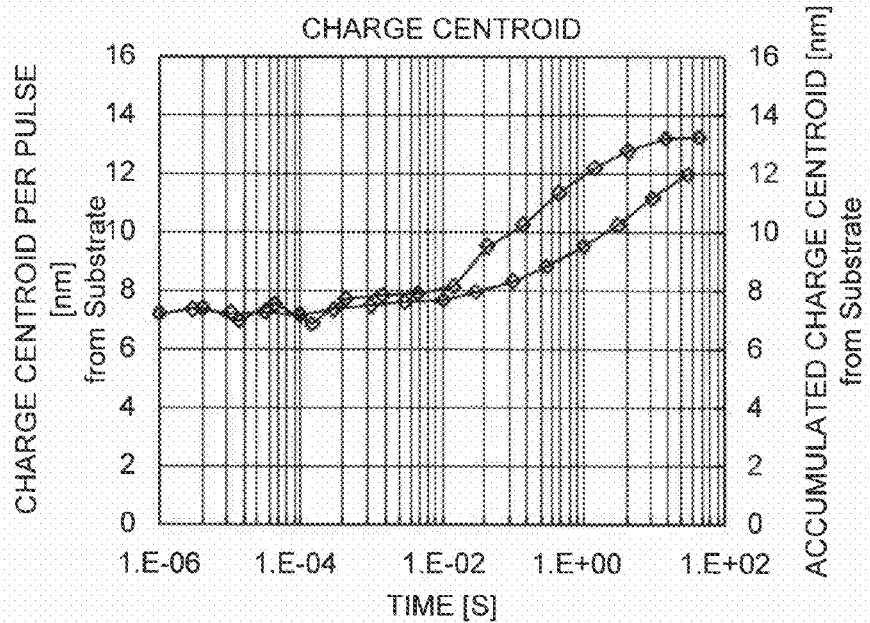
FIG. 17 is a graph showing an example of a measured result of a charge centroid.

FIG. 17 is a graph showing an example of a measured result of a charge centroid of the sample of the present application. In FIG. 17, an abscissa axis indicates application times of writing voltages. An ordinate axis indicates distances of the charge centroids from the silicon substrate 11.

In the above measurement, a sample is used in which a film thickness of $SiO_2$ (tunnel insulating film 12) is 5.3 nm and an EOT of a film thickness of $HfO_2$ (charge storage film 23) is 1.2 nm. It is found from FIG. 17 that the charge centroid is located around 7 nm from the silicon substrate 11 and that the charge exists between the $HfO_2$ film (charge storage film 23) and an $Al_2O_3$ film (block insulating film 14). Here, the charge centroid well coincides with a position in which existence of the region 21 is confirmed in the cross-sectional photographic view by the TEM of FIG. 9.

It should be noted that though there is a difference of 0.5 nm between the charge centroid (7 nm) of FIG. 17 and a sum of the film thickness (5.3 nm) of $SiO_2$ and the $SiO_2$-converted film thickness (1.2 nm) of $HfO_2$, the difference is due to a measurement error.

In FIG. 17, when the application time of the write voltage exceeds 10 ms, a location of the charge centroid becomes apart from the silicon substrate. This is because a leak current from the $HfO_2$ film (charge storage film 23) cannot be ignored any further and misalignment occurs when measuring.

It should be noted that an experiment is performed also on a sample in which a nitrogen content ratio [N] at a time of as deposition in a film whose composition at the time of as deposition having been HfON is 9 atomic % and 19 atomic %, about erasing characteristics and writing characteristics, similarly to on the sample of the present application. However, results about the erasing characteristics and the writing characteristics are not preferable.

(Nitrogen Annealing)

Here, a thermal processing will be described. In the description stated above, after the block insulating film 14 made of $Al_2O_3$ is formed, the thermal processing at 1000° C. for 30 seconds is performed in an oxygen atmosphere. However, also in a case that a thermal processing at 1000° C. for 30 seconds is performed in a nitrogen atmosphere after the block insulating film 14 made of $Al_2O_3$ is formed, good writing characteristics, erasing characteristics and charge holding characteristics can be obtained similarly to in a case of the oxygen atmosphere, though a measured result is not shown.

It is considered that the above is because oxygen (O) penetrates in the HfON film and then replaces nitrogen (N) in the HfON film, oxygen being abundantly contained in the $Al_2O_3$ film as long as a film quality of the $Al_2O_3$ film being the block insulating film 14 is equal to or higher than a predetermined level. It should be noted that being equal to or higher than the predetermined level of the film quality of the $Al_2O_3$ film means that a leak current is less than $10^{-6}$ $A/cm^2$ when an electric field applied to the $Al_2O_3$ film is about 10 MV/cm.

It is preferable that a thermal processing temperature is equal to or higher than 1000° C. and equal to or lower than 1200° C., considering requirement by the block insulating film 14, a diffusion layer or the like. Further, in view of prevention of heat damage, it is preferable that a thermal processing time is equal to or less than 30 seconds. Furthermore, in view of providing an effective thermal processing, it is preferable that the thermal processing time is equal to or more than one second.

(Lower Limit of Nitrogen Content Ratio)

Here, a nitrogen content ratio [N] in HfON before denaturation will be described. When the nitrogen content ratio [N] in HfON constituting the charge storage film 13 is 2 atomic %, good characteristics can be obtained as for the respective writing characteristics, erasing characteristics and charge holding characteristics. Meanwhile, when the nitrogen content ratio [N] in HfON is 9 atomic % and 19 atomic %, the writing characteristics and the erasing characteristics are unpreferable.

Based on the above, it is considered that the nitrogen content ratio [N] in HfON equal to or less than 2 atomic % and equal to or more than 0.002 atomic % improves the characteristics as the charge storage film 13. It should be noted that a lower limit of the nitrogen content ratio [N] in HfON is set to be 0.002 atomic %, since it is estimated that if the nitrogen content ratio is equal to or more than 0.002 atomic %, a diameter of a particle (region) containing an $N_2$ molecule is larger than a size (0.5 nm) of a unit cell of $HfO_2$ crystal being a minimum value of a diameter of the region 21. When it is assumed, with a sufficiently practical approximation, that a volume of gas whose main constituent is a nitrogen molecule eliminated from the HfON film is in proportion to a nitrogen content in HfON and that a number density of particles mainly constituted with the gas whose main constituent is the nitrogen molecule eliminated from the HfON film does not change even if the HfON nitrogen concentration changes, the lower limit of the nitrogen content ratio [N] in HfON is considered as the nitrogen content of 2 atomic %×(0.5 nm/5 nm)$_3$=0.002 atomic %, since the diameter of the region 21 under the nitrogen content ratio of 2 atomic % is 5 nm.

It should be noted that it is estimated that when the nitrogen content ratio [N] in HfON becomes small, a size of the region 21 generated in the interface between the charge storage film 13 and the block insulating film 14 becomes small and identifying a region containing a gas molecule becomes difficult even with a cross-sectional TEM image.

(Material of Charge Storage Film)

Here, a material of the charge storage film 13 will be described. When a $(Zr_{1-x}Hf_x)ON$ film ($0 \leq x < 1$) is used other than HfON as the material of the charge storage film 13 among film materials to be deposited, improvement can also be expected in the writing characteristics, the erasing characteristics and the charge holding characteristics.

Zirconium (Zr) has stronger bonding with oxygen (O) than bonding with nitrogen (N). Thus, it is expected that nitrogen (N) is dissociated by oxygen (O) diffusing into ZrON to generate a region containing a gas molecule in an interface with a block film. It should be noted that in such a case a charge storage film 23 from which nitrogen has been eliminated becomes a $(Zr_{1-x}Hf_x)O_2$ film ($0 \leq x < 1$).

Though ZrON or $ZrO_2$ has a melting point somewhat lower than that of HfON or $HfO_2$, that melting point is much higher than 1000° C. being the thermal processing temperature indicated in the present application. Thus, a difference in the melting point can be ignored.

Further, it is known that silicon (Si) and ZrON react to generate zirconium silicide even by a thermal processing at about 1000° C. when ZrON is disposed to directly contact a single-crystalline silicon substrate, a polycrystalline silicon substrate or the like. However, in the semiconductor storage element 1 according to the invention of the present application, the charge storage film does not directly contact the silicon substrate, so that zirconium silicide is not generated even if the thermal processing at about 1000° C. is performed.

(Sputtering Gas)

Here, sputtering gas will be described. As the material of the charge storage film 13, HfON or $Zr_{1-1}Hf_xON$ is used. However, also in a case that, other than HfON or $Zr_{1-x}Hf_xON$, an insulator whose band gap is smaller compared with both of the tunnel insulating film 12 and the block insulating film 14 is used as the charge storage film, if a film is formed by means of a sputtering method using argon (Ar), argon being sputtering gas is mixed into the charge storage film by about 1 atomic %.

It is also possible to increase an amount of argon contained in the charge storage film described above to about 3 atomic % by using a sputtering deposition condition in which energy of recoil argon from a target is high and the number of particles of recoil argon is large.

The sputtering deposition condition in which energy of recoil argon from the target is high and the number of particles of recoil argon is large can be obtained, for example, by adjusting an RF power of sputtering.

After a block insulating film 14 is deposited on the charge storage film formed by the above-described sputtering method, a thermal processing is performed in an appropriate process. Then, the charge storage film is highly densified so that a rare gas atom interposed in a lattice or the like is eliminated. Thus, a region 21 can be generated in an interface between the block insulating film 14 and the charge storage film. Then, as a result of generation of the region 21, a dangling bond is generated, so that writing characteristics, erasing characteristics and charge holding characteristics can be expected to be improved.

Figure 18:
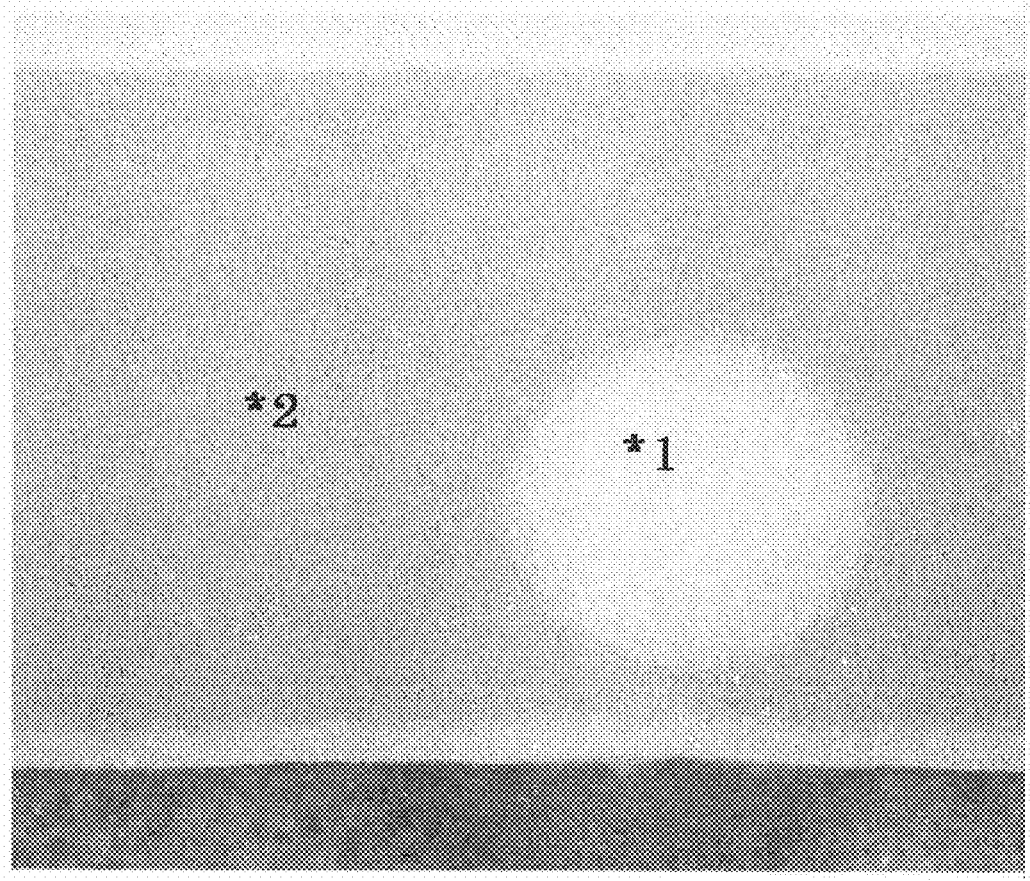
FIG. 18 is a cross-sectional photographic view indicating that a region containing a gas molecule constituted with rare gas is formed.

FIG. 18 is a cross-sectional photographic view indicating that, in an insulating film for LSI (Large Scale Integration) created by the above-described sputtering method, a region containing a gas molecule constituted with rare gas in sputtering gas is formed in the insulating film after heating.

Rare gas is detected by a TEM-EDX method from a portion indicated by *1 in FIG. 18. However, rare gas is scarcely detected from a portion indicated by *2 in FIG. 18 even by using the TEM-EDX method. Based on the above, it is considered that the portion indicated by *1 in FIG. 18 is a region containing a gas molecule constituted with rare gas. It should be noted that the EDX here means an energy dispersive X-ray spectroscopy.

It should be noted that for the sputtering deposition it is most common that argon is used as rare gas for sputtering deposition for a reason of manufacturing cost. However, since rare gas with a large atomic weight such as krypton (Kr) or xenon (Xe) has a large momentum, such rare gas has a deposition condition of being easily implanted into a block insulating film. Therefore, such rare gas is advantageous for generation of a region 21 by a subsequent thermal processing.

On the other hand, rare gas with a small atomic weight such as helium (He) or neon (Ne) is easy to be taken into a charge storage film in a deposition process of the charge storage film. Thus, such rare gas is advantageous for generation of the region 21 by the subsequent thermal processing.

If the rare gas such as argon (Ar), krypton (Kr), xenon (Xe), helium (He) or neon (Ne) is used as a major constituent or a mixed constituent, by adjusting the deposition condition to be appropriate, it is possible to increase a rare gas content in the charge storage film to about 5 atomic %. The above fact indicates that the region 21 can be easily generated in the interface between the block insulating film 14 and the charge storage film.

(Material of Block insulating Film)

Here, a material of the block insulating film will be described. As the material of the block insulating film 14, various insulating materials can also be used other than $Al_2O_3$. For example, it is possible to use an oxide insulating film which does not include nitrogen, such as $SiO_2$, $LaAlO_3$, LaAlSiO, HfAlO, ZrAlO, $HfO_2$, $ZrO_2$, HfLaO, ZrLaO, HfSiO, or ZrSiO. Since nitrogen (N) is hard to penetrate through an oxide insulating film, nitrogen (N) stays in the interface between the charge storage film 13 and the block insulating film 14 to form the region 21.

(Another Constitution of Semiconductor Storage Element)

Figure 19:
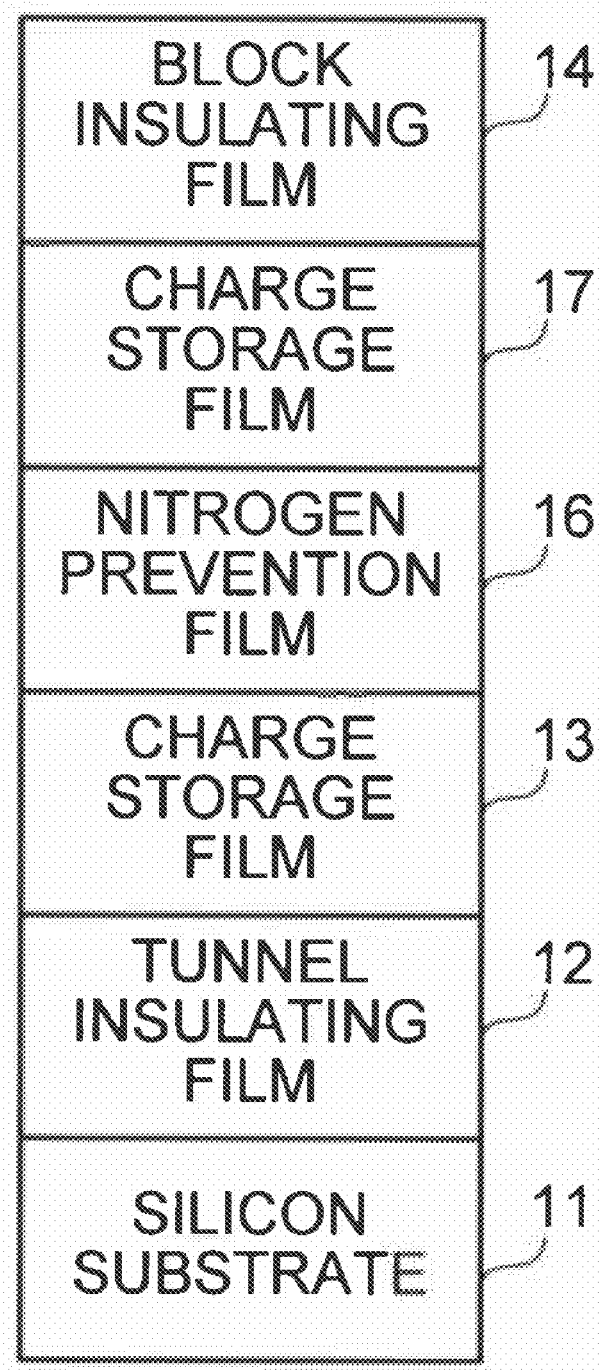
FIG. 19 is a cross-sectional view showing a fundamental structure of a semiconductor storage element according to another embodiment.

Hereinabove, the embodiment having only one layer of charge storage film 13 is described. However, the charge storage film 13 is not limited to be only one-layered. For example, as shown in FIG. 19, after a charge storage film 13 (first charge storage film) is formed, a nitrogen prevention film 16 through which nitrogen (N) is hard to penetrate, such as of $SiO_2$, is formed. Further, after a charge storage film 17 (second charge storage film) is formed on the nitrogen prevention film 16, a block insulating film 14 is formed, whereby the charge storage film 13 can be made two-layered.

Then, the thermal processing described in the embodiment of the present application is performed, whereby nitrogen in the charge storage film 13 is replaced by oxygen in an interface between the charge storage film 13 and the nitrogen prevention film 16 and in an interface between the charge storage film 17 and the block insulating film 14. Subsequently, by nitrogen in the charge storage film 13, regions 21 are generated in the interface between the charge storage film 13 and the nitrogen prevention film 16 and in the interface between the charge storage film 17 and the block insulating film 14.

As a result that the regions 21 are generated in the interface between the charge storage film 13 and the nitrogen prevention film 16 and in the interface between the charge storage film 17 and the block insulating film 14, charge storage characteristics, that is, writing characteristics, erasing characteristics and charge holding characteristics can be expected to be improved.

It should be noted that the above-described nitrogen prevention film is not limited to be one-layered but a plurality of layers can be formed. In reality, based on each film thickness of the charge storage film and the nitrogen prevention film as a single layer and a thickness of the entire charge storage film, it is considered that an upper limit of formation of the nitrogen prevention film is ten layers. Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage element, comprising:
   a source region and a drain region provided in a semiconductor substrate;
   a tunnel insulating film provided on the semiconductor substrate between the source region and the drain region;
   a charge storage film including a gas element, provided on the tunnel insulating film;
   a block insulating film provided on the charge storage film;
   a gate electrode provided on the block insulating film; and
   a region containing a gas molecule including the gas element, the region provided in a neighborhood of an interface between the charge storage film and the block insulating film.

2. The element according to claim 1, wherein the charge storage film includes hafnium oxide.

3. The element according to claim 1, wherein the gas molecule is a nitrogen molecule.

4. The element according to claim 1, wherein the gas molecule is rare gas.

5. The element according to claim 1, wherein the block insulating film is a metal oxide film.

6. The element according to claim 5, wherein the metal oxide film includes aluminum oxide.

7. A manufacturing method of a semiconductor storage element comprising:
   forming a tunnel insulating film on a semiconductor substrate;
   forming a charge storage film including a gas element on the tunnel insulating film;
   forming a block insulating film on the charge storage film;
   removing the gas element from the charge storage film by performing a thermal processing after the forming the block insulating film, and forming a region containing a gas molecule including the gas element in an interface between the charge storage film after the removing the gas element and the block insulating film; and forming a gate electrode on the block insulating film.

8. The method according to claim 7,
wherein the gas element is rare gas.

9. The method according to claim 8,
wherein the charge storage film includes hafnium oxide.

10. The method according to claim 7,
wherein the gas element is nitrogen.

11. The method according to claim 10,
wherein the charge storage film includes hafnium oxide.

12. The method according to claim 7, further comprising,
forming, between the charge storage film and the block insulating film, a nitrogen prevention film and a charge storage film in such a sequence.

13. The method according to claim 7,
wherein the block insulating film is a metal oxide film.

14. The method according to claim 13,
wherein the metal oxide film includes aluminum oxide.

15. The method according to claim 7,
wherein the charge storage film includes hafnium oxide.

16. A semiconductor storage element, comprising:
a semiconductor region;
a tunnel insulating film provided on the semiconductor region;
a charge storage film including a gas element, provided on the tunnel insulating film;
a block insulating film provided on the charge storage film;
a gate electrode provided on the block insulating film; and,
a region including a gas molecule having the gas element, the region provided in a neighborhood of an interface between the charge storage film and the block insulating film.

17. The element according to claim 16,
wherein the charge storage film includes hafnium oxide.

18. The element according to claim 16,
wherein the gas molecule is a nitrogen molecule.

19. The element according to claim 16,
wherein the gas molecule is rare gas.

20. The element according to claim 16,
wherein the block insulating film is a metal oxide film.

21. The element according to claim 20,
wherein the metal oxide film includes aluminum oxide.

* * * * *